(12) United States Patent
Olwitz

(10) Patent No.: US 6,377,469 B1
(45) Date of Patent: Apr. 23, 2002

(54) HOUSING HAVING A BACK PANEL WITH CONDUCTIVE INTERCONNECTS

(75) Inventor: Rudolf Olwitz, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/446,469
(22) PCT Filed: Jun. 17, 1998
(86) PCT No.: PCT/DE98/01660
§ 371 Date: Dec. 21, 1999
§ 102(e) Date: Dec. 21, 1999
(87) PCT Pub. No.: WO99/00742
PCT Pub. Date: Jan. 7, 1999

(30) Foreign Application Priority Data

Jun. 26, 1997 (DE) .......................................... 197 27 228

(51) Int. Cl.⁷ .............................................. H01R 12/16
(52) U.S. Cl. ...................................................... 361/788
(58) Field of Search ................................ 361/640, 788, 361/784, 684, 728; 710/102, 101, 103; 439/785, 61

(56) References Cited

U.S. PATENT DOCUMENTS

| 4,700,274 A | * 10/1987 | Laut ............................ 361/393 |
| 4,811,275 A | 3/1989 | Balogh, Jr. et al. |
| 4,882,702 A | 11/1989 | Struger et al. |
| 5,463,772 A | 10/1995 | Thompson et al. |
| 5,692,043 A | * 11/1997 | Gliga et al. .............. 361/788 X |
| 5,936,840 A | * 8/1999 | Satwinder .................... 361/728 |
| 5,958,030 A | * 9/1999 | Kwa ........................... 710/101 |
| 6,081,430 A | * 6/2000 | La Rue ....................... 361/788 |
| 6,202,110 B1 | * 3/2001 | Coteus et al. ............... 710/102 |

FOREIGN PATENT DOCUMENTS

| DE | 3608046 | 9/1987 |
| DE | 297 07 156 | 7/1997 |
| EP | 0 438 013 | 7/1991 |
| WO | WO 80/01628 | 8/1980 |

* cited by examiner

Primary Examiner—Neil Abrams
Assistant Examiner—Son V. Nguyen
(74) Attorney, Agent, or Firm—Schiff Hardin & Waite

(57) ABSTRACT

Electrical assemblies are introducable into the backplane via plug-connector systems. A processor assembly having a processor unit is thereby connectible to at least one bulk storage (LW1, . . . ,LW4) via a separate and/or control bus (DB). The respective bulk storage is accommodated on a separate bulk storage assembly. The data and/or control bus proceeding from the processor unit is conducted via the processor assembly, the backplane (BP) and the respective bulk storage assembly, being conducted thereover at least largely in the form of printed interconnects.

4 Claims, 1 Drawing Sheet

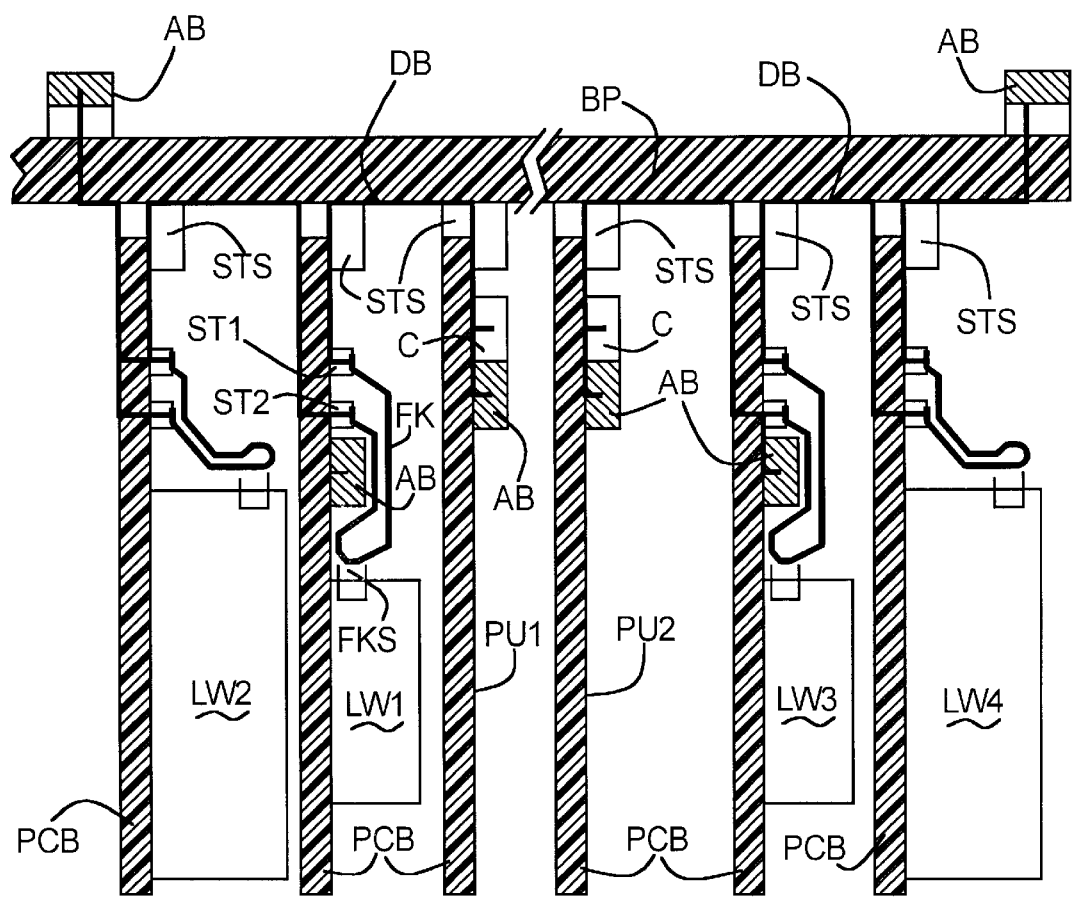

HOUSING HAVING A BACK PANEL WITH CONDUCTIVE INTERCONNECTS

BACKGROUND OF THE INVENTION

The invention is directed to a chassis having a backplane carrying printed interconnects which receive electrical assemblies with at least one assembly having a processor unit which is connected via a separate data and/or control bus to at least one bulk storage.

Large quantities of data are held in bulk stores in data processing and communication systems, and these are capable of either being accessed via a data and/or control bus, for example what is referred to as a "SCSI-2" data/control bus ("small computer system interface-2"), or being accessed proceeding from a processor unit. Proceeding from the processor unit in a ribbon cable, such an "SCSI-2" data/control bus deriving from the PC world is usually conducted as a DZ-chain from one bulk store to the next bulk store and is terminated (actively or passively) at both ends by a fixed bus termination. At the bulk storages, the bus signals are conducted onto the printed circuit board present in the respective bulk storage with spur lines via a plug-connector system.

When bulk storages are then to be co-incorporated in a chassis of data processing and communication systems, then this was previously achieved, particularly in PC technology, in that the connection of the bulk storages to one another and to a processor assembly is implemented with a ribbon cable or an electrically inadmissible lengthening of the spur line was accepted.

U.S. Pat. No. 4,811,275 discloses a chassis into which bulk storages can be integrated. However, this can only be achieved with added structural outlay.

SUMMARY OF THE INVENTION

An object of the present invention is then to disclose a way of how a chassis of the species initially cited can be fashioned in order to be able to integrate bulk storages in a chassis with comparatively little structural outlay.

This object is achieved by the data and/or control bus being conducted from a respective processor unit to a backplane or panel and the bus is conducted over each bulk storage assembly in the form of a bus loop proceeding at least largely in a printed circuit board as printed interconnects and the bulk storage is connected to the bus loop of the storage assembly. The invention thereby yields the advantage that, due to the omission of an aforementioned ribbon cable to be conducted from assembly to assembly as a daisy-chain, not only is a cost-saving established but the immunity to interference of, for example, a data processing or, respectively, communication system accommodated in a chassis is also improved compared to the traditional cable structure. No special wiring backplanes and additional EMC shielding measures are thereby required for the proposed guidance of data and/or control buses. Finally, no limitations are established or, respectively, no complicated manipulation is required for the installation or removal of bulk storages into or from a chassis. On the contrary, the assemblies containing the bulk storages can be plugged or, respectively, pulled under tension proceeding from the front side of the chassis, like the other assemblies.

Advantageous developments of the present invention include the data and/or control bus is parted on the printed circuit board of a bulk storage assembly and a ribbon cable plug-connector element is provided at the two bus transition locations, which are connected to the ribbon cable by ribbon cable plug-connector elements and an additional ribbon cable plug-connector is provided at the ribbon cable to connect a bulk storage assembly thereto. Preferably, the data and/or control bus is terminated at each end with a bus terminal. The advantages of these developments thereby derive on the basis of simple design measures in order to be able to connect a plurality of bulk storages to a processor unit in common via data and/or control bus. The advantage of the development is the possibility of being able to insert commercially obtainable bulk storages into the bulk storage assemblies, for example bulk storages known form PC technology.

The present invention is described in greater detail below on the basis of an exemplary embodiment schematically shown in a drawing. Only those structural and circuit-oriented elements that are required for an understanding of the present invention are thereby shown in the drawing.

BRIEF DESCRIPTION OF THE DRAWING

The FIGURE is a partial cross sectional view of a backplane or panel of a housing according to the invention.

DESCRIPTION OF THE PREFERRED EMBODIMENT

The drawing shows portions of a chassis that has a backplane BP carrying printed interconnects available to it. This backplane comprises plug-connector elements into which electrical assemblies are acceptable via complementary plug-connector elements. Two plug-connector elements complementary to one another are thereby referred to below together as plug-connector system STS.

Let said assemblies, whereof only one printed circuit board referenced PCB and having electrical interconnects available to it is shown, belong, for example, to a data processing or, respectively, communication system. PCs, for example, are also intended to be included among such systems. Of these assemblies, at least one is fashioned as a processor assembly with a processor unit PU1 or, respectively PU2. Two such processor assemblies are indicated in the drawing. Over and above this, two special assemblies for each of the two processor assemblies are indicated as an example on the basis of a printed circuit board PCB. This total of four special assemblies that are shown respectively serve for the acceptance of a bulk storage, for example in the form of a floppy drive. The bulk storage is provided on the individual special assemblies are thereby referenced LW1 through LW4. For storing and offering data signals or, respectively, control command sequences, let these bulk storages be drivable via data and/or control buses proceeding from the aforementioned processor units PU1 and PU2.

Further assemblies belonging to the assumed data processing or, respectively, communication system are not shown in the drawing since the embodiment of these assemblies is not the subject matter of the present invention.

The fashioning of the aforementioned data and/or control busses shall be described in greater detail below. Let it thereby be assumed as an example that the respective data and/or control bus DB is realized as what is referred to as a "SCSI-2" data/control bus ("small computer system interface-2"), as known from the PC world. Let it also be assumed that each of the two processor assemblies has its appertaining processor unit connected to respectively two bulk storages via a separate "SCSI-2" data/control bus. At the left-hand side of the drawing, two special assemblies with bulk storages LW1 and LW2 are allocated to a processor unit referenced PU1. In a corresponding way, two special assemblies having bulk storages LW3 and LW4 are allocated to a processor unit referenced PU2 at the right-hand side of the drawing. Since these systems present at both sides of the drawing are realized in the same way with respect to the appertaining "SCSI-2" data/control bus, the realization of such an "SCSI-2" data/control bus shall be explained below with reference only to the example of the system indicated at the left-hand side of the drawing.

Proceeding from a bus controller ("SCSI-2 controller") referenced C in the drawing and belonging to the processor unit PU1, the "SCSI-2" data/control bus DB initially proceeds via the printed circuit board PCB of the processor assembly belonging to the processor unit PU1 and the plug-connector system STS connected thereto to the backplane BP. Proceeding from this backplane, the "SCSI-2" data/control bus is then conducted to the plug-connector system STS of the bulk storage assembly neighboring the processor assembly. This thereby proceeds via a first contact row of the plug-connector system onto the component side of the printed circuit board PCB of the appertaining bulk storage assembly. From here, the "SCSI-2" data/control bus proceeds on the printed circuit board to a bus transition location at each of whose two sides a respective ribbon cable plug-connector element ST1 or, respectively, ST2 is soldered.

A ribbon cable FK is connected to the two ribbon cable plug-connector elements ST1 and ST2 via ribbon cable plug-connector elements complementary to these ribbon cable plug-connector elements. A further ribbon cable plug-connector element FKS is attached inside the ribbon cable, this serving for the connection of the bulk storage LW1 with the assistance of a complementary plug-connector element.

Proceeding from the second ribbon cable plug-connector element ST2, the "SCSI-2" data/control bus is then conducted on the other printed circuit board side to the bulk storage assembly belonging to the bulk storage LW1, namely up to the last contact row of the appertaining plug-connector system STS. The ribbon cable thus forms a bus loop via this bulk storage assembly.

Proceeding from the plug connector system STS that has just been mentioned, the "SCSI-2" data/control bus then proceeds again onto the backplane BP and, thereat, proceeds to the plug-connector system STS of the bulk storage assembly belonging to the bulk storage LW2. The "SCSI-2" data/control bus is then conducted thereon in the aforementioned way and is subsequently returned onto the backplane BP.

As indicated in the drawing, moreover, "SCSI-2" data/control bus is terminated in conformity with the specification rules on said processor assembly forming the start of the data/control bus and at the end of the data/control bus returned onto the backplane BP, being respectively terminated by a defined bus termination AB, for example a resistor network. The bus termination AB provided on the bulk storage assembly equipped with the bulk storage LW1 is deactivated at a bus termination at the end of the data/control bus that has just been mentioned above. An activation only ensues when the bulk storage assembly containing the bulk storage LW2 is not plugged into the backplane or panel BP.

The present invention was explained above with reference to the example of an "SCSI-2" data/control bus. This invention, however, is not limited to such an "SCSI-2" data/control bus but, on the contrary, can be generally employed upon utilization of an arbitrary data and/or control bus. Over and above this, a data and/or control bus of the present invention can also be modified with respect to the plurality of connectible bulk storages and, thus, with respect to the bus length. In particular, given employment of a single bulk storage, the data and/or control bus can be conducted only up to the bulk storage assembly containing this bulk storage and can be potentially terminated thereat with a defined bus termination in conformity with the bus specification. Moreover, a bus loop can also be formed on the printed circuit board of a bulk storage assembly by printed interconnects, namely upon omission of the aforementioned bus transition location (ST1 and ST2). Such a procedure, however, assumes that the respective bulk storage is correspondingly connectible to the data and/or control bus. This can be realized, for example, with the assistance of a connector element connected to the data and/or control bus that internally realizes a bus loop and additionally comprises a plug-connector element for the connection of a bulk storage.

I claim:

1. A chassis for a communication system, said chassis comprising a backplane carrying printed interconnects, a plurality of electrical assemblies being introduced by plug-connector systems into said interconnects, each electrical assembly including a printed circuit board, at least one of said electrical assemblies being a process assembly with a processing unit, at least one of said electrical assemblies being a separate bulk storage assembly, a separate data and/or control bus for connecting the processing unit to said at least one bulk storage assembly, said bus having printed interconnects extending from the processing unit via the printed circuit board of the processor assembly and the plug-connector system connected thereto to the backplane and being conducted from the backplane to the bulk storage assembly by a printed circuit board, the bus being connected from the respective processing unit to the backplane being conducted over each of the bulk storage assemblies in the form of a bus loop proceeding at least largely on a respective printed circuit board as a printed interconnect and the respective bulk storage being connected to the bus loop of the bulk storage assembly.

2. A chassis according to claim 1, wherein the data and/or control bus is respectively terminated with a bus termination at both ends of the bus.

3. A chassis according to claim 1, wherein the data and/or control bus are part of the printed circuit board of the respective bulk storage assembly and a respective ribbon cable plug connector element is provided at two bus transition locations and the two bus transition locations are connected via the printed circuit cable plug connector element to a ribbon cable which has a complementary ribbon cable plug connector element at both ends and includes an additional ribbon plug connector element provided at the ribbon cable forming a connection with a corresponding connector of the bulk storage of the bulk storage assembly.

4. A chassis according to claim 3, wherein the data and/or control bus is terminated with a bus termination at both of the ends of the bus.

* * * * *